(12) United States Patent
Hsiao et al.

(10) Patent No.: US 10,297,455 B2
(45) Date of Patent: May 21, 2019

(54) GATE OXIDE STRUCTURE AND METHOD FOR FABRICATING THE SAME

(71) Applicant: United Microelectronics Corp., Hsinchu (TW)

(72) Inventors: Shih-Yin Hsiao, Chiayi County (TW); Shu-Wen Lin, Hsinchu County (TW); Ke-Feng Lin, Taipei (TW); Hsin-Liang Liu, Tainan (TW); Chang-Lin Chen, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 160 days.

(21) Appl. No.: 15/292,775

(22) Filed: Oct. 13, 2016

(65) Prior Publication Data

US 2018/0108528 A1  Apr. 19, 2018

(51) Int. Cl.
| | |
|---|---|
| *H01L 21/8234* | (2006.01) |
| *H01L 21/28* | (2006.01) |
| *H01L 29/06* | (2006.01) |
| *H01L 29/423* | (2006.01) |
| *H01L 29/78* | (2006.01) |

(52) U.S. Cl.
CPC .. *H01L 21/28141* (2013.01); *H01L 21/28123* (2013.01); *H01L 21/28211* (2013.01); *H01L 29/0653* (2013.01); *H01L 29/42368* (2013.01); *H01L 29/78* (2013.01)

(58) Field of Classification Search
CPC ............... H01L 21/823462; H01L 21/823857

USPC .......................................................... 438/446
See application file for complete search history.

(56) References Cited

U.S. PATENT DOCUMENTS

| | | | |
|---|---|---|---|
| 6,656,824 B1 * | 12/2003 | Hanafi | H01L 21/28114 |
| | | | 257/E21.205 |
| 6,764,920 B1 | 7/2004 | Yang et al. | |
| 7,442,620 B2 | 10/2008 | Wu et al. | |
| 2002/0110968 A1 * | 8/2002 | Kim | H01L 21/76202 |
| | | | 438/197 |
| 2003/0022460 A1 | 1/2003 | Park | |
| 2014/0302662 A1 * | 10/2014 | Ma | H01L 21/32 |
| | | | 438/424 |

FOREIGN PATENT DOCUMENTS

| | | | |
|---|---|---|---|
| KR | 20020061255 A | * | 7/2002 |
| KR | 20040084569 A | * | 10/2004 |

* cited by examiner

*Primary Examiner* — Cuong Q Nguyen
*Assistant Examiner* — Peter M Albrecht
(74) *Attorney, Agent, or Firm* — J.C. Patents

(57) ABSTRACT

A method for forming a gate oxide layer on a substrate is provided, in which a region of the substrate is defined out by a shallow trench isolation (STI) structure. An oxide layer covers over the substrate and a mask layer with an opening to expose oxide layer corresponding to the region with an interface edge of the STI structure. The method includes forming a silicon spacer on a sidewall of the opening. A cleaning process is performed through the opening to expose the substrate at the region. An oxidation process is performed on the substrate at the region to form the gate oxide layer, wherein the silicon spacer is also oxidized to merge to an edge of the gate oxide layer.

14 Claims, 6 Drawing Sheets

GATE OXIDE STRUCTURE AND METHOD FOR FABRICATING THE SAME

BACKGROUND OF THE INVENTION

1. Field of the Invention

The present invention generally relates to semiconductor fabrication, in particular, to a gate oxide (GOX) of metal-oxide-semiconductor (MOS) device and a method to fabricate the gate oxide.

2. Description of Related Art

Electronic apparatus, such as TV, computer, mobile phone, memory device, and so on, with various functions and capability have been the necessities in everyday of modern life. The essential part of the electronic apparatus is the integrated circuit, which is fabricated by semiconductor fabrication technology. The integrated circuit in semiconductor fabrication is formed by a large number of MOS devices. A multi-functional integrated circuit with better capabilities would need more MOS devices to form the integrated circuit. In addition, a smaller and smaller size of the integrated circuit is also required to form the modern electronic apparatus.

When the size of the MOS devices is greatly reduced to adapt the need of the integrated circuit, the isolation between the MOS device is usually done by shallow trench isolation structure, which allows a small size to be formed. The MOS device usually includes a gate oxide layer between the gate structure and the substrate. Thus, the gate oxide layer is isolated by the shallow trench isolation (STI) structure.

The conventional process to form the gate oxide layer is the thermal oxidation on the substrate, so the silicon of the substrate is oxidized into gate oxide. Usually, the periphery or the edge of the gate oxide layer gets thinner as found in conventional structure. However, the thickness uniformity of the gate oxide layer is critical to determine the performance of the MOS device. So, the technology to improve the thickness uniformity of the gate oxide layer is still under developing.

SUMMARY OF THE INVENTION

Accordingly, the present invention is directed to the gate oxide structure and the method to fabricate the gate oxide structure with better thickness uniformity.

In an embodiment of the invention, a method for forming a gate oxide layer on a substrate is provided, in which a region of the substrate is defined out by a shallow trench isolation structure. An oxide layer covers over the substrate and a mask layer with an opening to expose oxide layer corresponding to the region with an interface edge of the STI structure. The method includes forming a silicon spacer on a sidewall of the opening. A cleaning process is performed through the opening to expose the substrate at the region. An oxidation process is performed on the substrate at the region to form the gate oxide layer, wherein the silicon spacer is also oxidized to merge to an edge of the gate oxide layer.

In an embodiment, the step for forming the silicon spacer comprises: forming a polysilicon layer over the substrate to at least cover the opening of the mask layer; and performing an etching back process, to etch the polysilicon layer until the mask layer is exposed.

In an embodiment, a thickness ratio of the mask layer to the polysilicon layer is in a range of 0.65 to 0.8.

In an embodiment, the thickness ratio is 0.7 to 0.8, or 0.7.

In an embodiment, a ratio of a width of the silicon spacer on the sidewall of the opening 208 to a thickness of the polysilicon layer as formed on the substrate is in a range of 0.65 to 0.8.

In an embodiment, a ratio of a width of the silicon spacer on the sidewall of the opening to a thickness of the gate oxide layer at a central region is in a range of 0.5 to 0.6.

In an embodiment, a material of the mask layer is silicon nitride.

In an embodiment, the gate oxide layer is a high voltage gate oxide layer.

In an embodiment, the cleaning process is a wet chemistry cleaning process.

In an embodiment, a thickness of the oxide layer is in a range of 100 Å to 120 Å.

In an embodiment, the opening of the mask layer stops at the oxide layer, and the cleaning process also cleans a portion of the oxide layer within the opening.

In an embodiment, the oxidation process is a high-voltage gate oxide (HVGOX) process.

In an embodiment of the invention, a gate oxide structure is provided, wherein a region on a substrate is isolated by a STI structure. The gate oxide structure includes a gate oxide layer, formed on a surface of the substrate at the region. An edge of the gate oxide layer abut the STI structure has a protruding part and a shape of the protruding part is spacer-like.

In an embodiment, the gate oxide layer comprises a first portion and a second portion, wherein the first portion is an oxide of the substrate at the region defined by the STI structure and the second portion is an oxide of a silicon spacer over a periphery of the region.

In an embodiment, the silicon spacer is disposed on a sidewall of an opening of a nitride layer over the substrate, wherein the opening exposes the region of the substrate defined by the STI structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
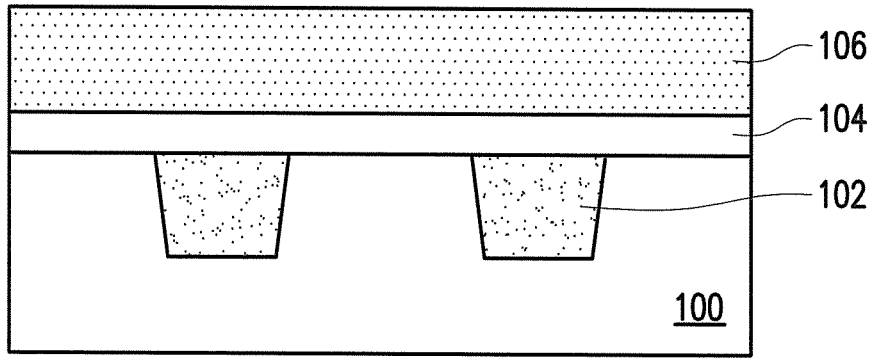
FIG. 1A to FIG. 1D are cross-sectional views, schematically illustrating a fabrication process to form a gate oxide layer as considered by the invention.

Reference will now be made in detail to the present preferred embodiments of the invention, examples of which are illustrated in the accompanying drawings. Wherever possible, the same reference numbers are used in the drawings and the description to refer to the same or like parts.

To improve the thickness uniformity for the gate oxide layer, the invention has looked into the issue, which may cause the thinner portion at the periphery of the gate oxide layer.

FIG. 1A to FIG. 1D are cross-sectional views, schematically illustrating a fabrication process to form a gate oxide layer as considered by the invention. The invention has looked into the conventional fabrication process for forming the gate oxide layer to find is the issue about the thickness uniformity. Referring to FIG. 1A, a STI structure 102 is formed in the substrate 100 to define a region of the substrate therebetween. A gate oxide layer of MOS device is to be formed over this region. Before forming the gate oxide layer, an oxide layer 104 is formed on the substrate 100, and a nitride layer 106 is formed on the oxide layer 104.

Figure 1B:
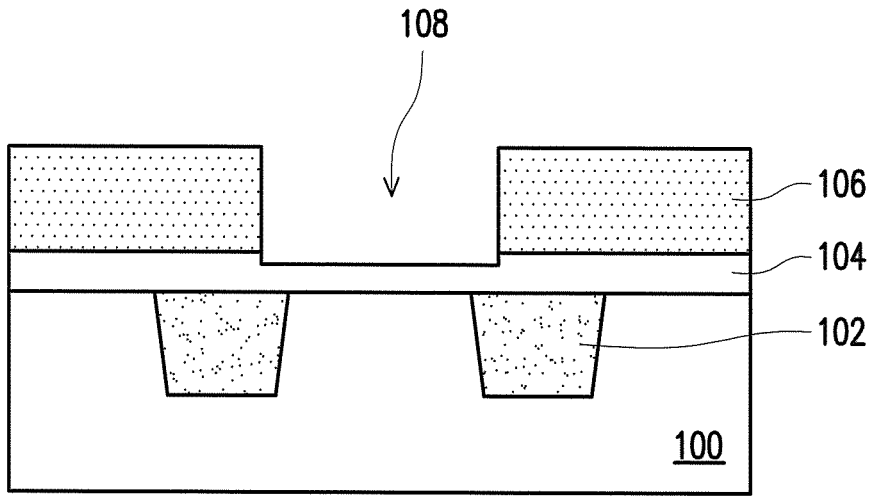

Referring to FIG. 1B, the nitride layer 106 is patterned to form an opening 108 corresponding to the region defined by the STI structure 102. The opening 108 exposes the oxide layer 104. The oxide layer 104 within the opening 108 may also etched by a portion. However, the oxide layer 104 within the opening 108 is still not fully etched to expose the substrate.

Figure 1C:
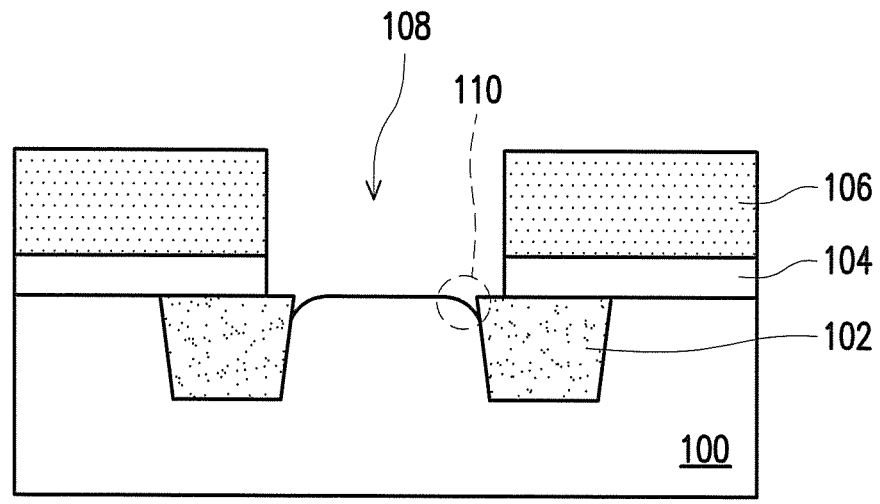
Figure 1D:
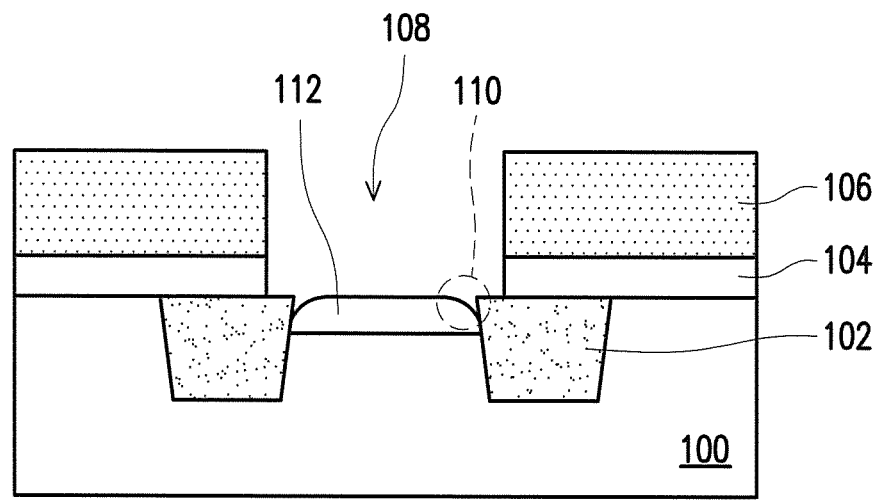

Referring to FIG. 1C, a cleaning process such as RCA cleaning process is performed to clean the oxide layer 104 within the opening 108. However, the interface edge 110 of the substrate 100, abutting the STI structure 102, is etched by a little more, causing an indent structure. Referring to FIG. 1D, when the thermal oxidation process such as a high voltage gate oxide (HVGOX) process is performed to oxidize the silicon of the substrate 100, so to form the gate oxide layer 112.

In the foregoing process to form the gate oxide layer 112, the thickness of the periphery of the gate oxide layer 112 at the interface edge 110 abutting the STI structure 102 gets reduced. In other words, the gate oxide layer at the periphery or the edge gets thinner. This would affect the performance of the MOS device later formed on the gate oxide layer. For example, if the MOS device is a low voltage device, the thinner edge of the gate oxide layer would cause kink effect in an example. If the MOS device is a high voltage device, the thinner edge of the gate oxide layer would result in a weak point of the device, and then easily cause a breakdown.

After looking into the issue occurring in the foregoing fabrication process for the gate oxide layer, the invention provide the fabrication process with effective improvement on the thickness uniformity. Embodiments are provided to describe the invention but the invention is not just limited to the embodiments as provided.

FIG. 2A to FIG. 2F are cross-sectional views, schematically illustrating a fabrication process to form a gate oxide layer, according to an embodiment of the invention.

Figure 2A:
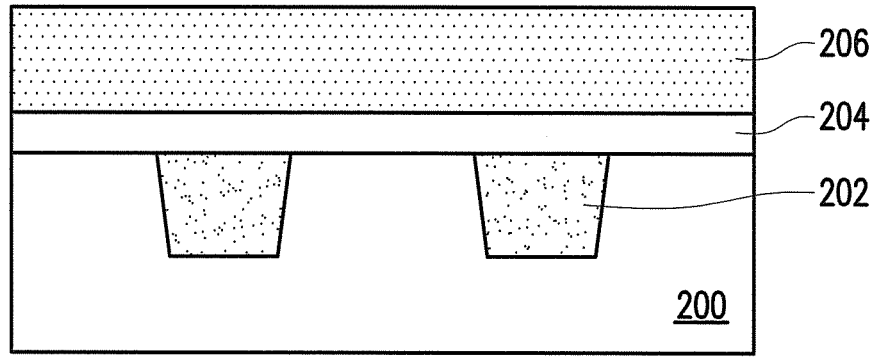
FIG. 2A to FIG. 2F are cross-sectional views, schematically illustrating a fabrication process to form a gate oxide layer, according to an embodiment of the invention.

Referring to FIG. 2A, a substrate 200 is provided for forming a MOS device in the subsequent processes. Before forming the MOS device, a STI structure 202 is formed in the substrate 200 to isolate and define out a region, on which a MOS device is to be formed. The MOS device can be a high voltage MOS device in an example, but limited to the high voltage MOS device. Then, an oxide layer 204 is deposited on the substrate 200. The oxide layer 204 can be a silicon oxide layer in an example. The thickness of the oxide layer 204 can be about 100 Å such as 110 Å, or in a range of 100 Å to 120 Å in an example. However, the thickness of the oxide layer is not limited to the embodiments. In addition, a nitride layer 206 is deposited on the oxide layer 204. The nitride layer 206 is silicon nitride layer in an example to serve as a mask layer. Here, the nitride layer 206 is taken as an example for the mask layer. The thickness of the nitride layer 206 is about 700 Å in an example but is not limited to the embodiment.

Figure 2B:
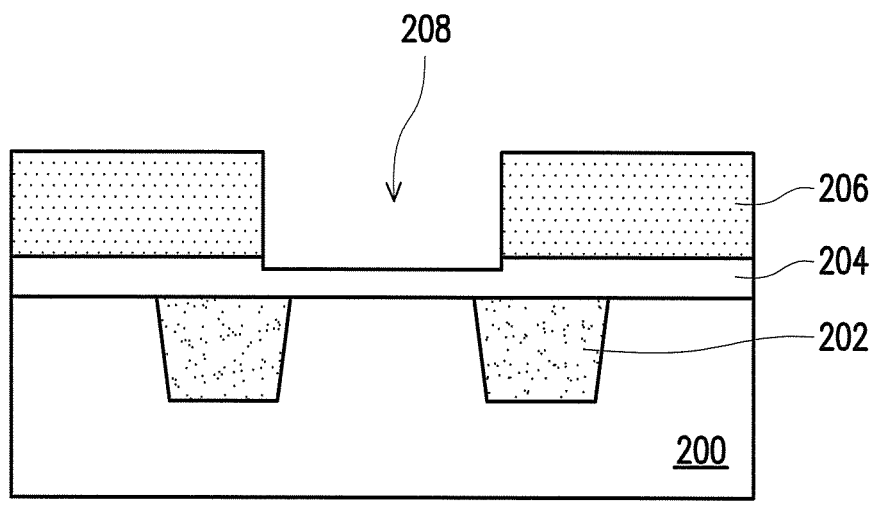

Referring to FIG. 2B, the nitride layer 206 is patterned to form an opening 208 in the nitride layer 206 and expose the oxide layer 204. The opening 208 is corresponding to the region defined by the STI structure 202. It can be noted that the opening 208 is extending to the STI structure 202.

Figure 2C:
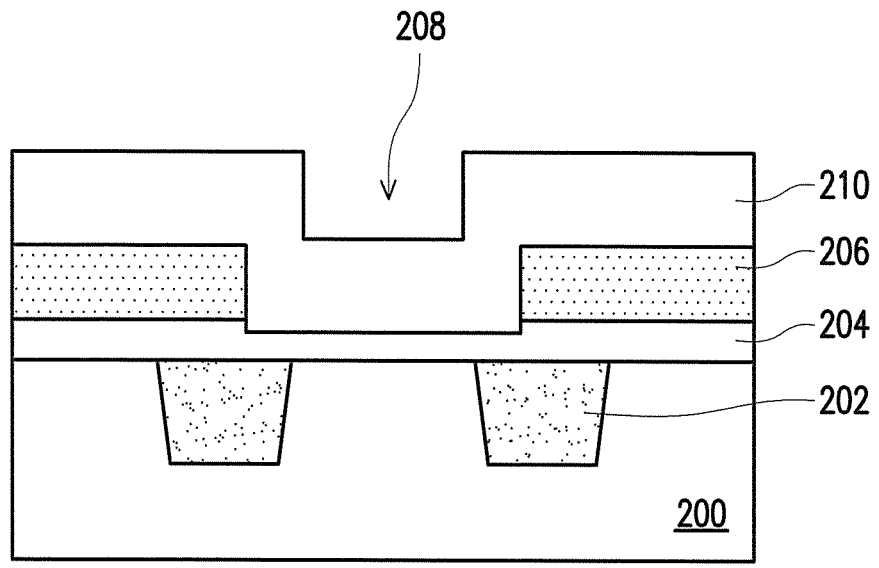

Referring to FIG. 2C, a silicon layer 210 is deposited over the substrate 200, on the nitride layer 206 and the exposed portion of the oxide layer 204. The silicon layer 210 is a polysilicon layer as an example and can be deposited by any proper deposition process without specific limitation. The silicon layer 210 also covers the opening 208 of the nitride layer 206 in a conformal structure, in which the sidewall of the opening 208 in the nitride layer 206 is also covered by a portion of the silicon layer 210.

The silicon layer 210 is to be used to form the spacer as to be described later, so the thickness of the silicon layer 210 should be sufficient to form the spacer. As comparing to the thickness of nitride layer 206, a thickness ratio of the nitride layer 206 to the silicon layer 210 is in a range of 0.65 to 0.8, or a range of 0.7 to 0.8, or 0.7, as the examples. So, in an example, the thickness of the silicon layer 210 is 1000 Å in an example.

Figure 2D:
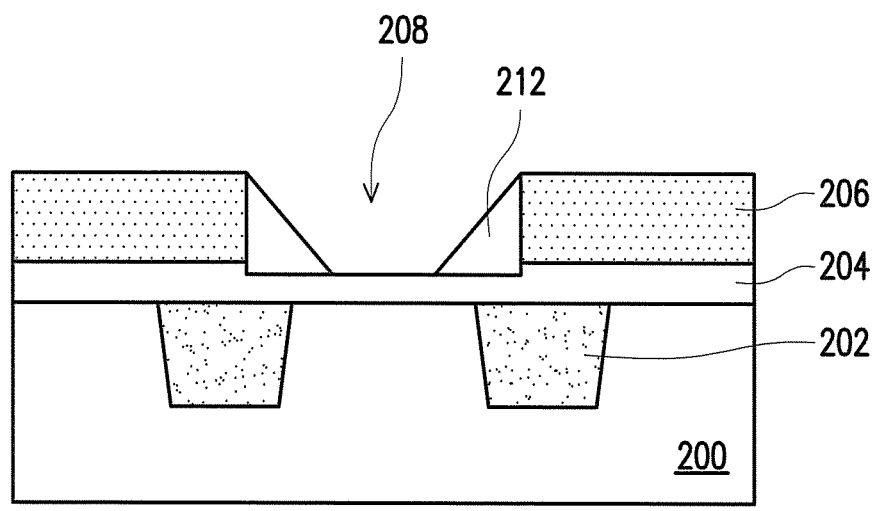

Referring to FIG. 2D, an etching back process is performed on the silicon layer 210 until the nitride layer 206 is exposed. A residual portion of the silicon layer 210 on the sidewall of the opening 208, not etched by the etching back process, becomes the silicon spacer 212. Here, the sidewall of the opening 208 actually is also a nitride sidewall of the nitride layer 206 as understood by the one with ordinary skill in the art.

The size of the silicon spacer 212 with a proper width from the sidewall of the opening 208, that is, a thickness of the silicon spacer 212 on the sidewall of the opening 208 can be set in other embodiments. For example, a ratio of a width of the silicon spacer on the sidewall of the mask layer (the opening 208) to the thickness of the silicon layer 210 being deposited is in a range of 0.65 to 0.8. In other words, the silicon spacer can be formed with a proper width in a range as the examples. However, the invention is not limited to the conditions in the examples.

Figure 2E:
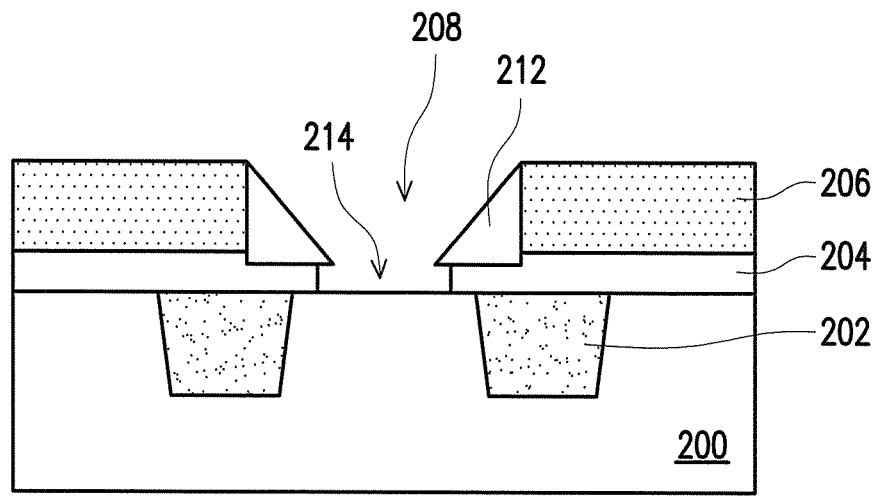

Referring to FIG. 2E, a cleaning process is performed to remove a portion of the oxide layer 204 within the opening 208, so to expose the substrate 200 at the region defined by the STI structure 202. The cleaning process can be the wet chemistry cleaning process or the RCA cleaning process in an example. As a result, a portion of the oxide layer 204 within the opening 208 is removed to expose the substrate 200.

Figure 2F:
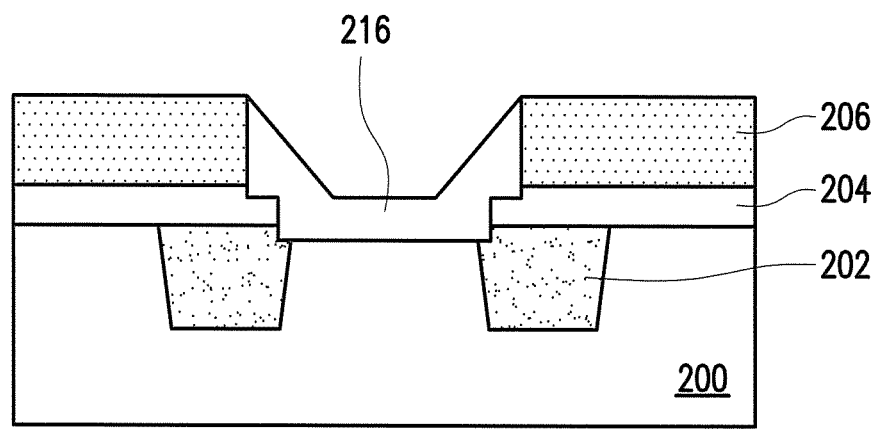

Referring to FIG. 2F, an oxidation process is performed on the substrate 200 at the region defined by the STI structure 202 within the opening 208, so to form the gate oxide layer 216. The oxidation process can be a thermal oxidation process or a HVGOX process, in which silicon material is oxidized into oxide. As noted, the silicon spacer 212 is also oxidized to merge to an edge of the gate oxide layer 216.

Further in an embodiment, a ratio of a width of the silicon spacer on the sidewall of the opening 208 to a thickness of the gate oxide layer 216 at the central region is in a range of 0.5 to 0.6.

Due to the silicon spacer 216, the thickness at the periphery of the gate oxide layer 216 can be compensated. The thinner phenomenon at the periphery of the gate oxide layer can be avoided. After the gate oxide layer 216 is formed in FIG. 2F, the subsequent processes can be performed to actually fabricate the MOS device as designed. For example, the nitride layer 206 and the oxide layer 204 would be removed and a gate structure can be formed subsequently.

However, the invention is not limited to the subsequent processes or subsequent structure to form the MOS device.

Figure 3:
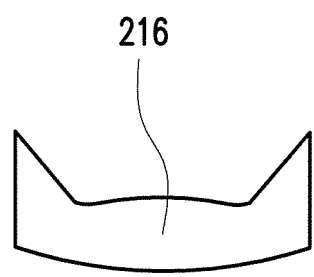
FIG. 3 is a cross-sectional view, schematically illustrating a structure of gate oxide layer, according to an embodiment of the invention.

From the structure point of view, the gate oxide layer 216 in cross-sectional view can have a protruding structure like a pair of ears. FIG. 3 is a cross-sectional view, schematically illustrating a structure of gate oxide layer, according to an embodiment of the invention.

In an example as referring to FIG. 3 and also to FIGS. 2A-2F, a gate oxide structure in an example is provided, in which a region on a substrate is isolated by a STI structure. The gate oxide structure includes a gate oxide layer 216, formed on a surface of the substrate at the foregoing region. An edge of the gate oxide layer 216 abutting the STI structure has a protruding part and a shape of the protruding part is spacer-like.

In better detail, the gate oxide layer 216 can include a first portion and a second portion. The first portion is an oxide of the substrate 200 at the region defined by the STI structure. In other words, the first portion of the gate oxide layer 216 is formed by directly oxidizing the silicon of the substrate. The second portion of the gate oxide layer 216 is an oxide of a silicon spacer over a periphery of the region.

In an embodiment, the silicon spacer is disposed on a sidewall of an opening of a nitride layer over the substrate, wherein the opening exposes the region of the substrate defined by the STI structure.

The invention has proposed the formation of silicon spacer 212 on the nitride sidewall of the nitride layer within the opening 208 before the cleaning process. As a result, the silicon spacer 212 can contribute a part of the gate oxide layer at the periphery after oxidation and provide the additional thickness to the periphery of the gate oxide layer. The performance of the MOS device can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a gate oxide layer on a substrate, wherein a region of the substrate is defined out by a shallow trench isolation (STI) structure, an oxide layer covers over the substrate, and a mask layer having an opening to expose a region of the oxide layer corresponding to the region of the substrate defined by the STI structure, comprising:

forming a silicon spacer on a sidewall of the opening, wherein the silicon spacer is overlapping over a periphery of the STI structure;

performing a cleaning process through the opening to expose the region of the substrate; and performing an oxidation process at the region of the substrate to form the gate oxide layer, wherein the silicon spacer is also oxidized to merge to an edge of the gate oxide layer.

2. The method of claim 1, wherein the step for forming the silicon spacer comprises:

forming a polysilicon layer over the substrate to at least cover the opening of the mask layer; and performing an etching back process, to etch the polysilicon layer until the mask layer is exposed.

3. The method of claim 2, wherein a thickness ratio of the mask layer to the polysilicon layer is in a range of 0.65 to 0.8.

4. The method of claim 3, wherein the thickness ratio is 0.7 to 0.8.

5. The method of claim 3, wherein the thickness ratio is 0.7.

6. The method of claim 2, wherein a ratio of a width of the silicon spacer on the sidewall of the opening to a thickness of the polysilicon layer as formed on the substrate is in a range of 0.65 to 0.8.

7. The method of claim 2, wherein a ratio of a width of the silicon spacer on the sidewall of the opening to a thickness of the gate oxide layer at a central region is in a range of 0.5 to 0.6.

8. The method of claim 1, wherein a material of the mask layer is silicon nitride.

9. The method of claim 1, wherein the gate oxide layer is a high voltage gate oxide layer.

10. The method of claim 1, wherein the cleaning process is a wet chemistry cleaning process.

11. The method of claim 1, wherein a thickness of the oxide layer is in a range of 100 Å to 120 Å.

12. The method of claim 1, wherein the opening of the mask layer stops at the oxide layer, and the cleaning process also cleans a portion of the oxide layer within the opening.

13. The method of claim 1, wherein the oxidation process is a high-voltage gate oxide (HVGOX) process.

14. The method of claim 1, wherein the substrate is a silicon substrate.

* * * * *